US007966162B1

(12) United States Patent (10) Patent No.: US 7,966,162 B1
Raghavan et al. (45) Date of Patent: Jun. 21, 2011

(54) HIERARCHICALLY SCOPED RESETTABLE VARIABLES IN GRAPHICAL MODELING ENVIRONMENTS

(75) Inventors: Vijay Raghavan, Framingham, MA (US); Ebrahim Mehran Mestchian, Newton, MA (US)

(73) Assignee: The MathWorks, Inc., Natick, MA (US)

( * ) Notice: Subject to any disclaimer, the term of this patent is extended or adjusted under 35 U.S.C. 154(b) by 855 days.

(21) Appl. No.: 11/648,425

(22) Filed: Dec. 29, 2006

(51) Int. Cl.
*G06G 7/48* (2006.01)
(52) U.S. Cl. .............................. 703/6; 703/13
(58) Field of Classification Search .................. 703/6, 13
See application file for complete search history.

(56) References Cited

OTHER PUBLICATIONS

The MathWorks, Inc.; "Simulink: Model-Based and System-Based Design, Using Simulink Version 4", 2001, 846 pages.*
Artur Krukowski et al., "Simulink/Matlab-to-VHDL Route for Full-Customs/FPGA Rapid Prototyping of DSP Algorithms", 1999, Matlab DSP Conference, pp. 1-10.*
Patrick Niemeyer & Joshua Peck, "Exploring Java", 1997, O'Reilly & Associates, downloaded on Jun. 7, 2010 from http://www.selfsecurity.org, Chapter 5, pp. 1-7.*
The MathWorks, "Stateflow® and Stateflow® Coder For Complex Logic and State Diagram Modeling User's Guide Version 5", 2002, pp. 1-772.*

* cited by examiner

*Primary Examiner* — Jason Proctor
(74) *Attorney, Agent, or Firm* — Nelson Mullins Riley & Scarborough LLP; Kevin J. Canning; Matthew T. Fagan

(57) ABSTRACT

The illustrative embodiments of this invention are directed to a method, a medium and a system for realizing resettable hierarchically scoped variables in a graphical modeling environment on a computing device. The method includes creating at least one resettable variable in a model within the graphical modeling environment, wherein the resettable variable is hierarchically scoped. The resettable variable is reset to a preset value before or during a subsequent invocation of a part of the model that contains the resettable variable. The graphical modeling environment may be a state diagramming environment or the graphical modeling environment may be a time-based graphical modeling environment.

17 Claims, 11 Drawing Sheets

*500*

Create at least one resettable hierarchically scoped variable in a a model in the time-based graphical modeling environment, 505

↓

Reset the at least one resettable variable to a preset value before or during a subsequent invocation of a part of the model containing the at least one resettable variable, 510

Determine an execution context of a resettable Data Store Memory definition block, 510a

Reset a value of the resettable Data Store Memory before execution of a first block in the execution context, 510b

↓

Generate code from the model, 520

500

```
┌─────────────────────────────┐
│ Create at least one resettable│
│ hierarchically scoped variable in a│
│ a model in the time-based    │
│ graphical modeling environment,│
│ 505                         │
└─────────────────────────────┘
              │
              ▼
┌─────────────────────────────┐
│ Reset the at least one      │
│ resettable variable to a preset│
│ value before or during a    │
│ subsequent invocation of a part│
│ of the model containing the at│
│ least one resettable variable,│
│ 510                         │
│ ┌─────────────────────────┐ │
│ │ Determine an execution context│
│ │ of a resettable Data Store│ │
│ │ Memory definition block, 510a│
│ └─────────────────────────┘ │
│              ▼               │
│ ┌─────────────────────────┐ │
│ │ Reset a value of the resettable│
│ │ Data Store Memory before │ │
│ │ execution of a first block in the│
│ │ execution context, 510b  │ │
│ └─────────────────────────┘ │
└─────────────────────────────┘
              │
              ▼
┌─────────────────────────────┐
│ Generate code from the      │
│ model, 520                  │
└─────────────────────────────┘
```

```
Create at least one resettable
hierarchically scoped variable in a
selected part of a state diagram,
605
```
↓
```
Assign the at least one resettable
variable a value before or during an
invocation of the selected part of
the state diagram, 610
```
↓
```
Reset the at least one resettable
variable to a preset value during a
subsequent invocation of the
selected part of the state diagram,
615
```
↓
```
Generate code from the
state diagram, 620
```

*Fig. 3C*

HIERARCHICALLY SCOPED RESETTABLE VARIABLES IN GRAPHICAL MODELING ENVIRONMENTS

BACKGROUND OF THE INVENTION

A dynamic system (either natural or man-made) is a system whose response at any given time is a function of its input stimuli, its current state, and the current time. Such systems range from simple to highly complex. Physical examples of dynamic systems include a falling body, the rotation of the earth, bio-mechanical systems (muscles, joints, etc.), bio-chemical systems (gene expression, protein pathways), weather and climate pattern systems, etc. Examples of man-made or engineered dynamic systems include: a bouncing ball, a spring with a mass tied to an end, automobiles, airplanes, control systems in major appliances, communication networks, audio signal processing, nuclear reactors, a stock market, etc. Professionals from diverse areas such as engineering, science, education, and economics build mathematical models of dynamic systems in order to better understand system behavior as it changes with the progression of time. The mathematical models aid in building better systems, where "better" may be defined in terms of a variety of performance measures such as quality, time-to-market, cost, speed, size, power consumption, robustness, etc. The mathematical models also aid in analyzing, debugging and repairing existing systems (be it the human body or the anti-lock braking system in a car). The models may also serve an educational purpose of educating others on the basic principles governing physical systems. The models and results are often used as a scientific communication medium between people.

Historically, engineers and scientists have utilized time-based block diagram models in numerous scientific and engineering areas such as Feedback Control Theory and Signal Processing to study, design, debug, and refine dynamic systems. Dynamic systems, which are characterized by the fact that their behaviors change over time, are representative of many real-world systems. Time-based graphical modeling has become particularly attractive over the past years with the advent of software packages, such as Simulink®. Such packages provide sophisticated software platforms with a rich suite of support tools that make the analysis and design of dynamic systems efficient, methodical and cost-effective.

In contrast, state-based and flow diagram modeling environments, such as Stateflow®, are useful to model event-driven systems. State-based environments provide graphical design and development tools for modeling and simulating event-driven systems and subsystems. State diagramming environments describe complex system behavior using state diagrams, which include both logic and internal data and can be used to visually depict a current state during the operation of the system being modeled. The state-based and flow diagram modeling environments provide a graphical design and development tool for describing complex system behavior using finite state machine theory, truth tables, flow diagram notations, and state-transition diagrams. State diagramming environments may enable users to graphically represent hierarchical and parallel states of systems and event-driven transitions between states.

Within conventional graphical modeling environments, a variable that is hierarchical in scope is usually persistent, meaning that it exists from one invocation to the next and retains its value from one invocation to the next. Users of state diagramming environments and time-based graphical modeling environments often use different terms. For a state diagram a hierarchically scoped variable may be a state variable and an invocation may be a "wake-up" of a chart. For some time-based graphical modeling environments a variable may be a digital system memory variable and an invocation may be an execution of the model. Within block diagramming environments a variable that is not hierarchical in scope is typically not persistent. It is volatile and may not exist between invocations or retain its value from one invocation to the next. Block diagramming environments may, be unduly constrained by linking persistence to scope. If a user would like a hierarchically scoped variable to revert to a particular value for each invocation, then the user must insert blocks or code to manually assign the particular value to the variable before it is first accessed during an invocation. In complicated block diagrams, determining where to initialize the hierarchically scoped variable may not be simple or straightforward.

SUMMARY

Illustrative embodiments are directed to a method, a medium holding executable instructions and a system for providing resettable variables that are hierarchically scoped within a graphical modeling environment.

One illustrative embodiment creates at least one resettable hierarchically scoped variable in a model within a graphical modeling environment on a computing device. The at least one resettable hierarchically scoped variable is reset to a preset value before or during a subsequent invocation of a part of the model containing the at least one resettable variable. According to aspects of the illustrative embodiment, the subsequent invocation may be a function call. A graphical representation of the at least one resettable hierarchically scoped variable in the graphical modeling environment may differ in appearance from a graphical representation of a non-resettable hierarchically scoped variable in the graphical modeling environment. The method may further include generating code for the model. The generated code may be, for example, C, C++, Java, Javascript, Python, or a hardware description language. The hardware description language may be, for example, Verilog, VHDL or SystemC. Resetting the at least one hierarchically scoped variable to a preset value during a subsequent invocation of a part of the model may occur directly after the invocation of the part of the model and before any other activity. The method may include obtaining from a user a condition for resetting the at least one resettable variable, wherein the at least one resettable variable is reset during a particular subsequent invocation only if the condition is satisfied.

The graphical modeling environment may be a time-based graphical modeling environment. The model may be a block diagram, the at least one resettable hierarchically scoped variable may be a Data Store Memory (DSM) and the subsequent invocation may be an execution at a subsequent time step. Resetting the at least one resettable variable to a reset value during a subsequent invocation of the selected part of the block diagram may include determining an execution context of a Data Store Memory definition block and resetting a value of the Data Store Memory before execution of a first block in the execution context.

Another embodiment is a method in a computing device having a state diagramming environment. The method includes creating at least one resettable variable in a selected part of a state diagram within the state diagramming environment, wherein the resettable variable is hierarchically scoped. The method also includes assigning the at least one resettable variable a value before or during an invocation of the selected part of the state diagram and resetting the at least one resettable variable to a preset value during a subsequent invocation of the selected part of the state diagram. According to aspects of an embodiment, the step of creating at least one resettable variable in a selected part of a state diagram within a state diagramming environment may be in response to a determination from a user that a hierarchically scoped variable in a selected part of a state diagram within the state diagramming environment will be resettable.

Another embodiment is a medium for use with a computing device holding instructions executable by the computing device for performing any of the aforementioned methods.

Another illustrative embodiment is a system for generating and displaying a graphical modeling application. The system includes a memory adapted to hold a value of a resettable hierarchically scoped variable used in a graphical model. The system also includes an execution engine adapted to execute the model upon invocation of the model. The system further includes a reset mechanism adapted to reset the value of the resettable hierarchically scoped variable to a preset value upon execution of a part of the model containing the resettable hierarchically scoped variable. The graphical modeling application may be a time-based graphical modeling application and the graphical model may be a time-based graphical model. Alternately, the graphical modeling application may be a state diagramming application and the model may be a state diagram. The graphical modeling application may be an event based graphical modeling application and the graphical model may be an entity flow network.

A further illustrative embodiment is another system for generating and displaying a graphical modeling application. The system includes means for creating at least one resettable variable in a selected part of a model within the graphical modeling application, wherein the at least one resettable variable is hierarchically scoped. The system also includes means for assigning the at least one resettable variable a value during an invocation of the selected part of the model. The system also includes means for assigning the at least one resettable variable a value during an invocation of the selected part of the model. The system further includes means for resetting the at least one resettable value to a preset value during a subsequent invocation of the selected part of the model.

BRIEF DESCRIPTION OF THE DRAWINGS

The aforementioned features and advantages, and other features and aspects of the present invention, will become better understood with regard to the following description and accompanying drawings, wherein:

FIG. 3B is a flow chart illustrating steps in a time-based graphical modeling environment for realizing a resettable hierarchically scoped variable according aspects of an illustrative embodiment;

FIG. 3C is a flow chart illustrating steps in a state diagramming environment for realizing a resettable hierarchically scoped variable according to another aspect of the illustrative embodiment;

DETAILED DESCRIPTION OF THE INVENTION

Figure 1:
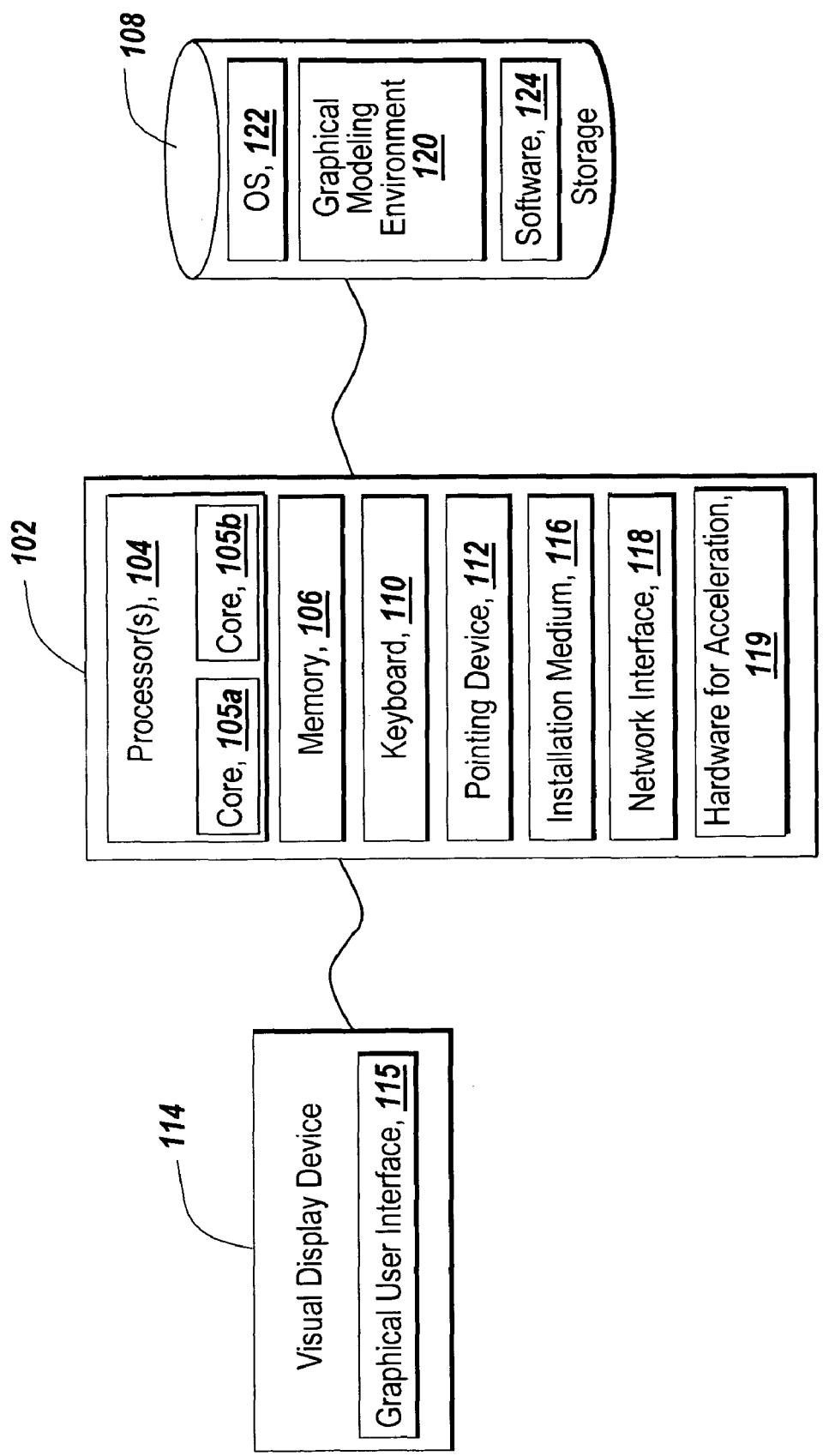
FIG. 1 is a schematic diagram of an illustrative computing device for practicing an illustrative embodiment of the present invention.

FIGS. 1 through 5B illustrate example embodiments of the invention, wherein a resettable variable that is hierarchically scoped, is realized within a model in a graphical modeling environment. In conventional graphical modeling environments, a variable that is hierarchical in scope is persistent, meaning that it exists from one invocation to the next and retains its value from one invocation to the next. If a user would like a hierarchically scoped variable to revert to a particular value for each invocation, then the user must insert blocks to manually write the particular value to the variable before it is first accessed for each invocation. In complicated block diagrams, determining where to initialize the hierarchically scoped variable may not be simple or straightforward. Illustrative embodiments of the present invention decouple persistence and scope by providing a resettable hierarchically scoped variable within a graphical modeling environment.

The illustrative embodiments will be primarily described with respect to a generic block diagram graphical modeling environment, a state diagramming environment and a time-based graphical modeling environment. Although both state diagramming environments and time-based block diagram environments are defined as block diagram graphical modeling environments, state-based environments and time-based environments often use different terms for equivalent structures.

The illustrative embodiments will be described, solely for illustrative purposes, relative to a state diagramming environment and time-based graphical modeling environment provided by the software products from The MathWorks, Inc. of Natick, Mass. Although the illustrative embodiments will be described relative to a Stateflow® based application and a Simulink® based application, one of ordinary skill in the art will appreciate that the present invention may be applied to other state diagramming environments or time-based graphical modeling environments, such as any environment using software products of LabVIEW® or MATRIX® from National Instruments, Inc, or other off-the-shelf or custom-built modeling environments.

Further examples of graphical modeling environments that may be used to develop and/or execute a graphical model in accordance with exemplary embodiments include, but are not limited to, LabVIEW® or MATRIXx from National Instruments, Inc., SoftWIRE by Measurement Computing, VisSim by Visual Solutions, WiT by DALSA Coreco, VEE Pro by Agilent, Dymola from Dynasim AB, Extend from Imagine That, Inc., Scicos from The French National Institution for Research in Computer Science and Control (INRIA), MSC.Adams® from MSC.Software Corporation, Rhapsody® from iLogix, Inc., Rational® from International Business Machines Corporation, ARTiSAN Studio from ARTiSAN Software Tools, Inc., SCADE™ from Esterel Technologies, Inc., among others.

Although the illustrative embodiments will be described with respect to different forms of block diagram graphical modeling environments, one of ordinary skill in art will appreciate that the present invention also encompasses graphical modeling environments that do not employ block diagrams.

Many graphical modeling environments employ block diagrams. Hierarchical block diagrams are diagrams in which a block is located (visually or logically) within another block. A block within another block is said to be a sub-block or a child block. A block that has another block within it is said to be a super-block or a parent block. The sub-blocks within a super-block or parent block are also known as its children or its descendents. In some systems, a block in which a hierarchically scoped variable is located determines the scope of that variable. The scope of a hierarchically scoped variable may encompass the parent block of that variable and all of the descendants of that parent block.

FIG. 1 depicts an environment suitable for practicing an illustrative embodiment of the present invention. The environment includes a computing device 102 having memory 106, on which software according to one illustrative embodiment of the present invention may be stored, a processor (CPU) 104 for executing software stored in the memory 106, and other programs for controlling system hardware. Optionally, the computing device 102 may include multiple CPUs 104 for executing software loaded in the memory 110, and other programs for controlling system hardware. Each of the CPUs can be a single or a multiple core processor 105a, 105b.

The memory 106 may comprise a computer system memory or random access memory such as DRAM, SRAM, EDO RAM, MRAM, etc. The memory 106 may comprise other types of memory as well, or combinations thereof. The code loaded in the memory 106 may run in a virtualized environment, such as in a Virtual Machine (VM). Multiple VMs may be resident on a single processor. Also, part of the application may be run in hardware, for example, by configuring a field programmable gate array (FPGA) or creating an application specific integrated circuit (ASIC). Further, part of the application may be run on analog electronic devices or other resources may be used to run part of the application, such as graphics processing units (GPUs) or dedicated hardware such as Fast Fourier Transform (FFT) processing blocks. Additionally, the computing device 102 may include a hardware accelerator 119.

A human user may interact with the computing device 102 through a visual display device 114 such as a computer monitor, which may be used to display a graphical user interface (GUI) 115. The computing device 102 may include other I/O devices such a keyboard 110 and a pointing device 112, for example a mouse, for receiving input from a user. Optionally, the keyboard 110 and the pointing device 112 may be connected to the visual display device 114. Additionally, the computing device 102 may include any type of input device for receiving user input, such as, for example, a joystick, a thumbwheel, an accelerometer or gyroscope based device, a neuro interface device, etc. In other illustrative embodiments, the computing device 102 may include any type of haptic or tactile feedback device, such as a vibration generating mouse, or a force feedback device such as a force feedback joystick. Also, the computing device 102 may include any type of sound producing I/O device such as any suitable sound card. The computing device 102 may include other suitable conventional I/O peripherals.

For installing software programs, the computing device 102 may support any suitable device readable medium 116, such as a CD-ROM, DVD-ROM, floppy disk, tape device, USB device, hard-drive, or any other suitable device. The computing device 102 may further comprise a storage device 108, such as a hard-drive or CD-ROM, for storing an operating system 122 and other related software 124 and executable instructions. The graphical modeling environment 120 may comprise software that is installed via a device readable medium 116 and stored in the storage device 108. Additionally, the operating system and graphical modeling environment 120 can be run from a bootable CD, such as, for example, KNOPPIX®, a bootable CD for GNU/Linux.

Additionally, the computing device 102 may include a network interface 118 to interface to a Local Area Network (LAN), Wide Area Network (WAN) or the Internet through a variety of connections including, but not limited to, standard telephone lines, LAN or WAN links (e.g., IEEE 802.11, IEEE 802.16, T1, T3, 56 kb, X.25), broadband connections (e.g., ISDN, Frame Relay, ATM), cluster interconnection (Myrinet), peripheral component interconnections (PCI, PCI-X), wireless connections (e.g., Bluetooth), or some combination of any or all of the above. The network interface 118 may comprise a built-in network adapter, network interface card, PCMCIA network card, card bus network adapter, wireless network adapter, USB network adapter, modem or any other device suitable for interfacing the computing device 118 to any type of network capable of communication and performing the operations described herein. Moreover, the computing device 102 may be any computer system such as a workstation, desktop computer, server, laptop, System-on-Chip, Multi-processor System-on-Chip, handheld computer or other form of computing or telecommunications device that is capable of communication and that has sufficient processor power and memory capacity to perform the operations described herein.

Figure 2A:
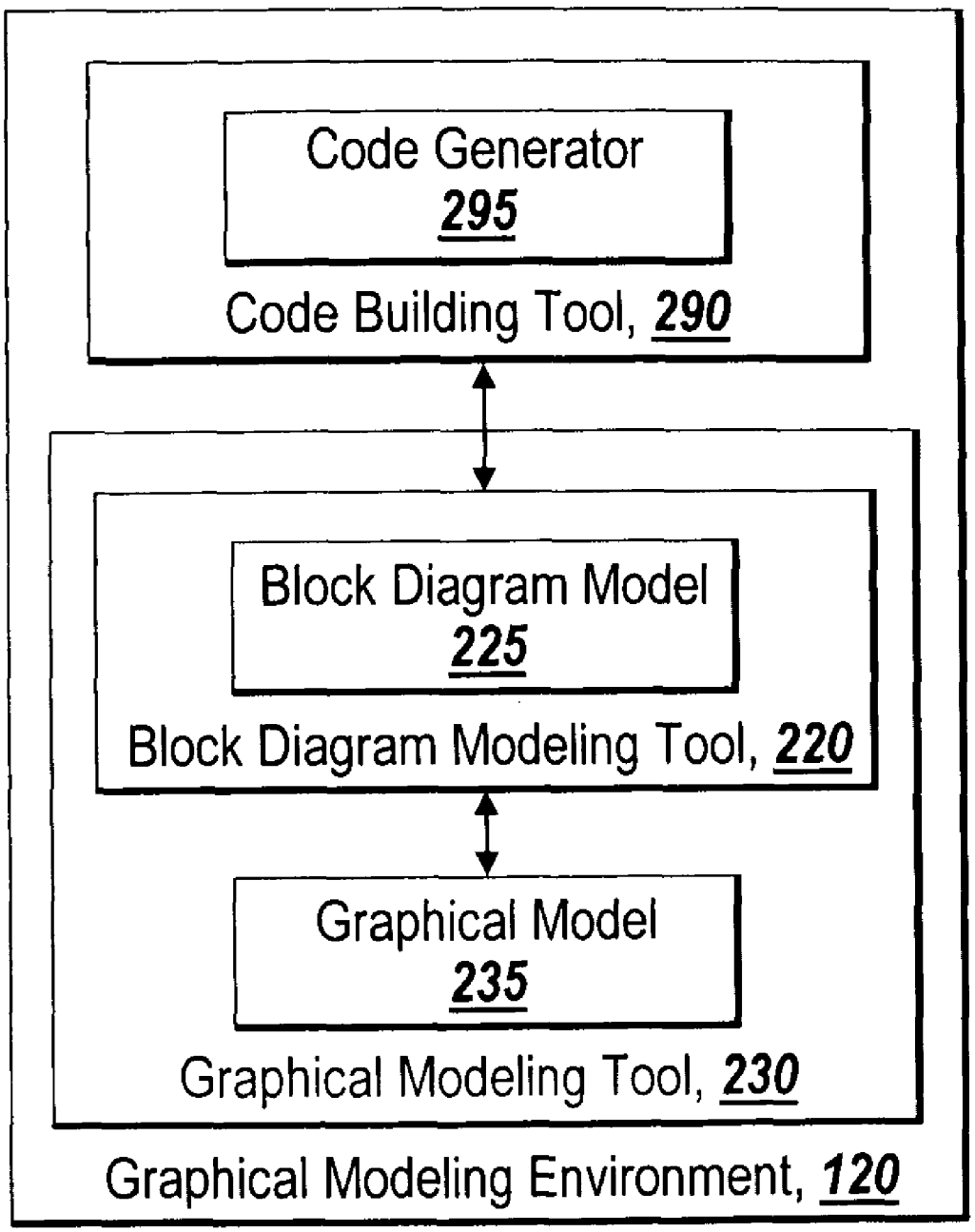
FIG. 2A is a schematic diagram of an illustrative graphical modeling environment for practicing an illustrative embodiment of the present invention on the computing device of FIG. 1.

In one aspect, an illustrative embodiment is related to a graphical modeling environment 120 as illustrated in FIG. 2A. In brief overview, the illustrative graphical modeling environment 120 includes a block diagram modeling tool 220, a graphical modeling tool 230, and a code building tool 290. The block diagram modeling tool 220 provides an environment for the design, development, testing, simulation, and execution of a block diagram model 225. The graphical modeling tool 230 provides an environment for the design, development, testing, simulation, and execution of a graphical model 235, such as a block diagram model 225. The graphical modeling tool 230 may also provide for incorporating or referencing a block diagram model 225 via the graphical model 235. The graphical modeling environment may include a code building tool 290. Additionally, the code building tool may include a code generator 295 to provide for the code generation and building of executable forms of the block diagram model 225 and/or graphical model 235. The block diagram modeling tool 220 may be in communication with the graphical modeling tool 230 via any suitable type and form of interface. The code building tool 290 can be in communication with or otherwise have any suitable type and form of interface to the block diagram modeling tool 220 and/or the graphical modeling tool 230.

The illustrative block diagram modeling tool 220 of an illustrative embodiment comprises a design and development environment for creating any type and/or form of block diagram model 225, which may also be referred to as a state machine diagram model, a state diagram, a state chart or chart, a time-based simulation model, a Unified Modeling Language diagram such as, for example, a class diagram or a scenario diagram, a model designed using a domain specific formalism, an entity flow network, etc. A suitable entity flow network graphical modeling application would be SimEvents™ by The MathWorks, Inc. of Natick. In an illustrative embodiment and by way of example, the block diagram modeling tool 220 may comprise Stateflow® by The MathWorks, Inc. of Natick, Mass. In the illustrative embodiment of STATEFLOW, the block diagram model 225 may be referred to as a STATEFLOW chart. STATEFLOW integrates with graphical modeling tools, such as Simulink® by The MathWorks, Inc. of Natick, Mass., to model, simulate, and analyze systems. In one illustrative embodiment, STATEFLOW provides for the design and development of deterministic, supervisory control systems in a graphical environment. The block diagram modeling tool 220, if in the state diagramming embodiment, provides for state machine representation, flow diagram notations, and state-transition diagrams all in the block diagram model 225.

A graphical model, in the state diagramming environment, may comprise a graphical representation of a state machine, such as a finite state machine, a hybrid automaton, or a non-deterministic state machine, where states and transitions form the building blocks of a system. As known to those ordinarily skilled in the art, a state machine is a representation of an event driven system where the system makes a transition from one state to another state provided any conditions associated with the transition are met. A state may be a mode of behavior that can be either active or inactive based on inputs, outputs, transitions, conditions, and invariants. A transition links one state to another state and may have a condition, such as any logic, computation, algorithm, or executable instruction, used to determine if and when a transition between states may occur. Transitions are triggered by events. "Actions" may take place during the execution of a state diagram. An action may occur upon entering a state, while in a state, upon leaving a state, or upon a transition.

In some illustrative embodiments of the graphical model in the state diagramming environment, any of the states may be specified to have either a parallel (AND) or an exclusive (OR) decomposition with respect to any sub-states associated with a state, such as in the illustrative embodiment of Stateflow® as the block diagramming tool 220. A state with a parallel decomposition may comprise one or more sub-states that are active at the same time when the state is active and/or another sub-state is active. For example, one or more selected sub-states may be active in parallel or at the same time when the state is active. A state with an exclusive decomposition may comprise only one sub-state that is active when the state is active. One ordinarily skilled in the art will recognize and appreciate how states and sub-states may be specified or configured to operate in a parallel or exclusive manner.

The block diagramming tool 220 in the graphical modeling environment may provide elements such as states, junctions, and functions, such as graphical functions of Simulink® and/or Stateflow®, that may be placed and arranged graphically in a window, design area or otherwise collectively in a block diagram model 225. States and junctions may be connected together in the block diagram model 225 to form flows and transitions for an implementation of a state machine. The block diagram modeling tool 220 and/or block diagram model 225 may provide for parallelism in that two or more orthogonal blocks or states may be active at the same time. Additionally, the block diagram modeling tool 220 and/or block diagram model 225 may provide a mechanism for specifying transitions and/or conditions based on historical information related to execution of the block diagram model 225. Additionally, the block diagram modeling tool 220 and/or block diagram model 225 may use any type and/or form of graphical element to visually represent elements, such as for state machine representation, in block diagram model 225.

Figure 2B:
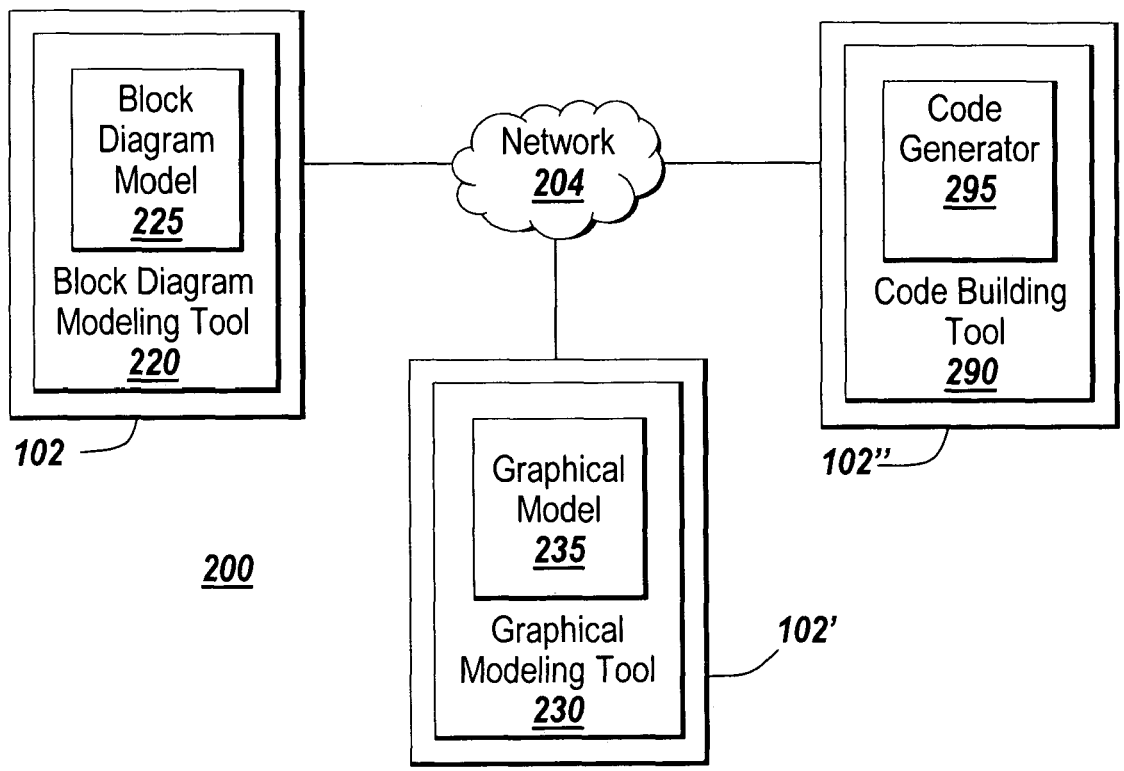
FIG. 2B is a schematic diagram of another illustrative graphical modeling environment for practicing an illustrative embodiment of the present invention in a network environment.

FIG. 2B depicts another environment suitable for practicing an illustrative embodiment of the present invention, wherein portions of the present invention are distributed in a network environment. In a broad overview, a system 200 depicts a network 204 environment for running portions of the graphical modeling environment 120 of the present invention on multiple computing devices 102, 102' and 102". The system 200 includes multiple computing devices 102, 102', and 102" connected to and communicating over a network 204. The block diagram modeling tool 220, graphical modeling tool 230, and optional code building tool 290 can be capable of and configured to communicate to each other over the network 204 by any suitable means and/or mechanisms. In some illustrative embodiments, the graphical modeling environment 120 may use the MATLAB® Distributed Computing Toolbox and Distributed Computing Engine to distribute and process any portions of the operations of the present invention described herein.

The network 204 can be a local area network (LAN), such as a company Intranet, a metropolitan area network (MAN), or a wide area network (WAN) such as the Internet. In one illustrative embodiment (not shown), the network 204 comprises separate networks, which may be of the same type or may be of different types. The topology of the network 204 over which the computing devices 102, 102', 102" communicate may be a bus, star, ring or other network topology. The network 204 and network topology may be of any such network 204 or network topology capable of supporting the operations of the present invention described herein.

The computing devices 102, 102', and 102" can connect to the network 204 through a variety of connections including standard telephone lines, LAN or WAN links (e.g., T1, T3, 56 kb, X.25, SNA, DECNET), broadband connections (ISDN, Frame Relay, ATM, Gigabit Ethernet, Ethernet-over-SONET), cluster interconnections (Myrinet), peripheral component interconnections (PCI, PCI-X), and wireless connections, or some combination of any or all of the above. Connections can be established using a variety of communication protocols (e.g., TCP/IP, IPX, SPX, NetBIOS, Ethernet, ARCNET, Fiber Distributed Data Interface (FDDI), RS232, IEEE 802.11, IEEE 802.11a, IEEE 802.11b, IEEE 802.11g, IEEE 802.16, IEEE 1394 (FireWire or i.LINK), CAN, CORBA, Remote Procedure Call, Remote Method Invocation and direct asynchronous connections).

The network 204 and network connections may include any transmission medium between any of the computing devices 102, 102', and 102" such as electrical wiring or cabling, fiber optics, electromagnetic radiation or via any other form of transmission medium capable of supporting the operations of the present invention described herein. The methods and systems of the present invention may also be embodied in the form of computer data signals, program code, or any other type of transmission that is transmitted over the transmission medium, or via any other form of transmission, which may be received, loaded into, and executed, or otherwise processed and used by a computing device 102, 102' and 102" to practice the operations of the present invention as described herein.

Each of the computing devices 102, 102', and 102" may be configured to and capable of running any portion of the graphical modeling environment 120. The graphical modeling environment 120 and/or any portion thereof, such as the block diagram modeling tool 220, graphical modeling tool 230, and code building tool 290 can be capable of and configured to operate on the operating system that may be running on any of the computing devices 102, 102', and 102". Each computing device 102, 102', and 102" can be running the same or different operating systems. Additionally, block diagram modeling tool 220, graphical modeling tool 230, and code building tool 290 can be capable of and configured to operate on and take advantage of different processors of any of the computing devices 102, 102', and 102". One ordinarily skilled in the art will recognize the various combinations of operating systems and processors that can be running on any of the computing devices.

Figure 2C:
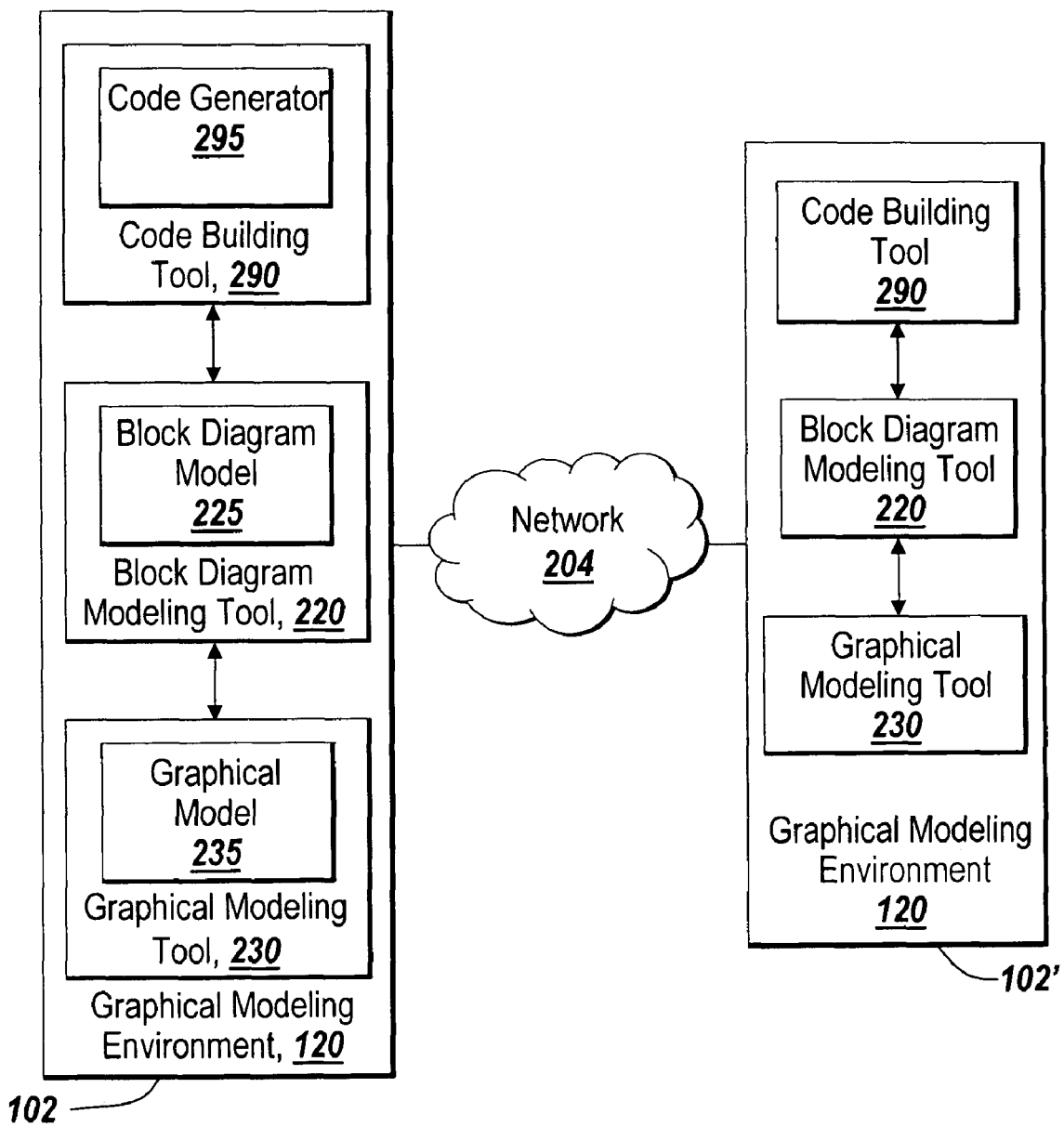
FIG. 2C is a schematic diagram of another illustrative graphical modeling environment for practicing an illustrative embodiment of the present invention in a distributed environment.

FIG. 2C depicts another illustrative embodiment of the invention, wherein portions of the present invention are practiced in a client/server architecture in a network environment. In a broad overview, the illustrative graphical modeling environment 120 of the present invention includes a client computing device 102 connected to and in communication with a server computing device 102' over a network 204. The block diagram modeling tool 220, graphical modeling tool 230 and/or optional code building tool 290, can be capable of and configured to have respective portions run on each of the client 102 and the server 102'. In one illustrative embodiment, the block diagram modeling tool 210 may have a first portion running on the client 102 and a second portion 210' running on the server 102'. For example, the block diagram modeling tool 210 may have a client portion 210 on the client 102 for providing and displaying the block diagram model 225, and a server portion 210' on the server 102' that may include application functionality and other processing, such as storing and/or retrieving portions of the block diagram model 225 from a database. Likewise, in other illustrative embodiments, the graphical modeling tool 230 may also have a client portion 230 and a server portion 230', and the code building tool 290, a client portion 290 and a server portion 290'. One ordinarily skilled in the art will recognize and appreciate how the block diagram modeling tool 220, graphical modeling tool 230, and/or optional code building tool 290 may be capable of and configured to execute with a client portion and a server portion in a client/server architecture.

Additionally, the block diagram modeling tool 220, graphical modeling tool 230, and/or optional code building tool 290 may be deployed such that portions of the graphical model 235 and/or block diagram model 225 may execute on certain portions of the network 204 and/or on certain computing devices 102, 102', or 102". For example, some functionality of the graphical model 235 and/or block diagram model 225 may be time critical or sensitive, and therefore may be targeted to execute on a computing device 102, 102' and 102" and a segment or portion of the network 204 with desired performance and/or operating characteristics. Other functionality of the graphical model 235 and/or block diagram model 225 may not be time-sensitive and may be targeted to be deployed to any computing device 102, 102', and 102" available on the network 204.

Figure 3A:
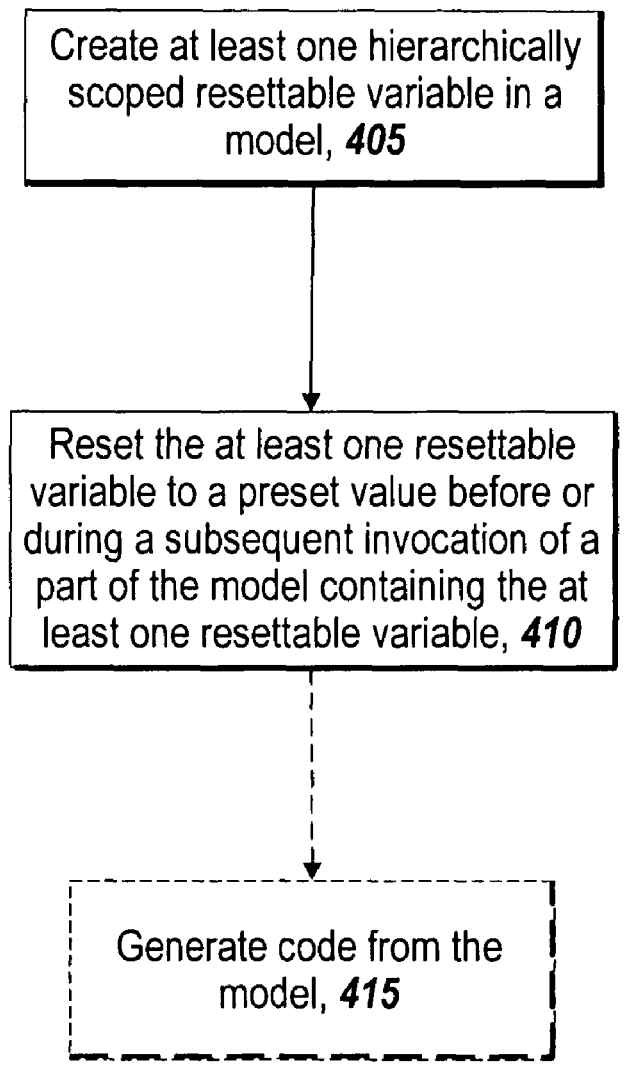
FIG. 3A is a flow chart illustrating steps in a graphical modeling environment for realizing a resettable hierarchically scoped variable according to an aspect of the illustrative embodiment.

FIG. 3A presents a flow chart illustrating the steps for realizing a resettable hierarchically scoped variable in a model in a graphical modeling environment 400, according to an illustrative embodiment. Initially, at least one resettable variable is created in a model within a graphical modeling environment, wherein the resettable variable is hierarchically scoped (step 405). The graphical modeling environment may be time-based, state-based, or a combination of time-based and state-based. The resettable hierarchically scoped variable is reset to a preset value before or during a subsequent invocation of a part of the model containing the resettable hierarchically scoped variable (step 410). The resettable variable may be reset on the next invocation, or the resettable variable may be reset on a subsequent invocation that is not the next invocation. A hierarchically scoped variable may be visible to the parent block (super block) of the block in which the variable is located and may be visible to all of the descendant blocks (sub-blocks) of the block in which the variable is located. A further step of generating code (step 415) may be used in an alternative embodiment of the invention. The code may be generated in C, C++, Java, Javascript, Python, a Hardware Description Language (HDL), VHDL, Verilog, SystemC, MATLAB and/or any other suitable computer language. The generated code may be user configured with a Target Language Compiler (TLC) or through an Application Program Interface (API) into an intermediate representation. Additionally, any of the graphical models may be subsequently simulated and/or executed in any way.

Within a graphical modeling environment, a graphical representation of the at least one resettable hierarchically scoped variable in the graphical modeling environment may differ in appearance from a graphical representation of a non-resettable hierarchically scoped variable in the graphical modeling environment. This would allow a user of the graphical model in the graphical modeling environment to quickly identify which hierarchically scoped variables are resettable and which hierarchically scoped variables are not.

The graphical modeling environment 120 may employ, an execution engine to execute the model when the model is invoked. An execution engine may use any combination of functions, procedures, subroutines or other suitable mechanisms to execute the model. According to aspects of an illustrative embodiment, the graphical model may employ a reset mechanism to reset a value of a hierarchically scoped variable during the execution of a model. The value of this hierarchically scoped variable may be held in memory 106.

Figure 5A:
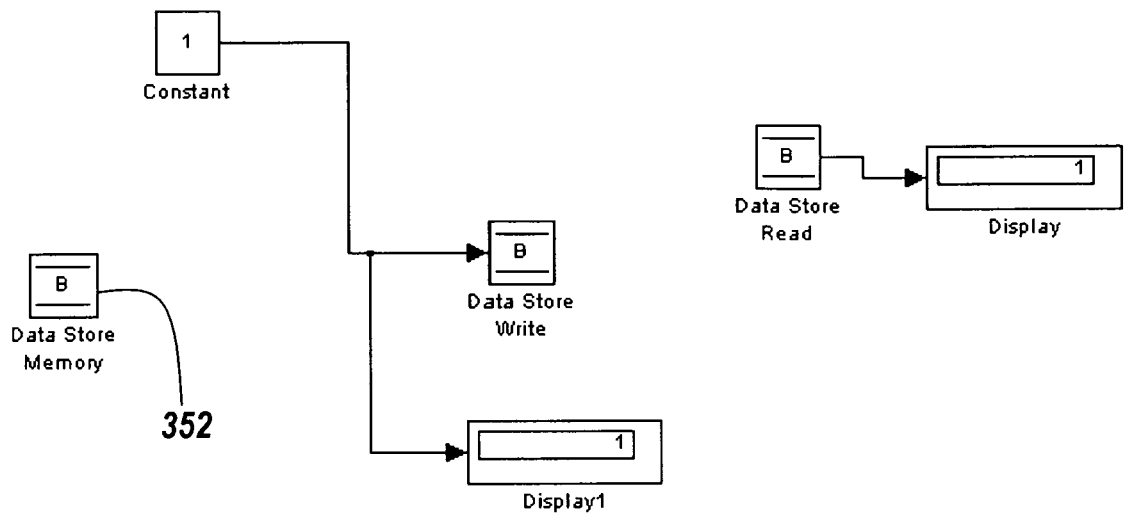
FIG. 5A depicts a conventional time-based block diagram within the Simulink® environment.

Within a time-based graphical modeling environment, such as Simulink® from The MathWorks, Inc. a hierarchically scoped variable may be a data store memory (DSM). An invocation of a block or subsystem within SIMULINK is described as an "execution" of the block or subsystem. SIMULINK provides a way of sharing data across multiple blocks or subsystems without explicit line connections via data store memory/read/write blocks. FIG. 5A depicts a conventional SIMULINK diagram 350. The block named "Data Store Memory" 352 defines a data-store memory location named "B". The properties of the DSM block, which can be specified by the user, determine the type of data that can be stored at that memory location, i.e. double-precision floating point, signed 16-bit integer, unsigned 32-bit integer, real, complex, etc. The properties of the DSM block may also determine the name of the variable stored in the data store memory location and the initial value of the variable stored in the data store memory location. The block named "Data Store Read" is used to read from the DSM and the block named "Data Store Write" is used to write to the DSM. The DSM data access blocks (read/write) can be placed anywhere in the hierarchy of the subsystem where the DSM definition block exists. Conventional DSM variables are persistent, meaning that the variables exist and maintain their values throughout the simulation (from one execution to the next).

FIG. 3B depicts a flowchart 500 of the steps performed in realizing a resettable hierarchically scoped variable in a time-based graphical modeling environment. Initially, at least one resettable hierarchically scoped variable is created in a model in the time-based graphical modeling environment (step 505). The at least one resettable variable is reset to a preset value before or during a subsequent invocation of a part of the model containing the at least one resettable variable (step 510). assigned a value during an invocation of the selected part of the model (step 510). The at least one resettable hierarchically scoped variable is reset to have a preset value during a subsequent invocation of the part of the model containing the at least one resettable variable. The at least one resettable variable may be reset before the at least one resettable variable is first read for each invocation. Alternately, the at least one resettable variable may be reset at the conclusion of processing for a particular invocation or at any other useful time during the invocation. The resettable variable may be reset based on conditional criteria.

Figure 5B:
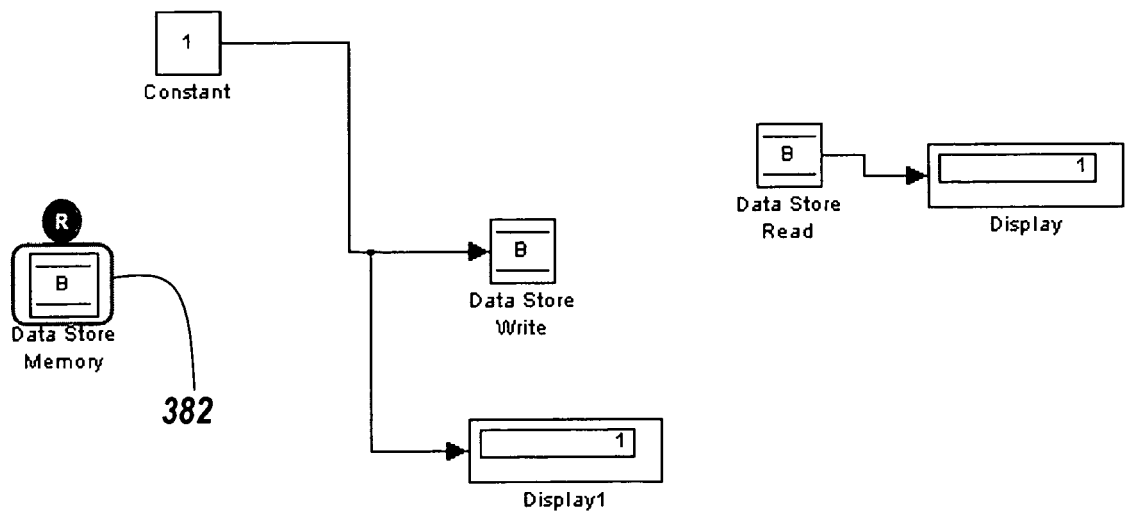
FIG. 5B depicts the time-based block diagram of FIG. 5A with a graphical modification indicating that a variable is resettable.

According to aspects of the illustrative embodiment, the time-based graphical modeling environment may be a block diagram environment such as the Simulink® environment. In SIMULINK and similar environments, the resettable hierarchically scoped variable may be a resettable Data Store Memory. Time-based graphical models are often evaluated at time steps. The subsequent invocation may be an execution at a subsequent time step. According to an aspect of the illustrative embodiment, code may be generated from the model (step 520). Although the time-based graphical model may include a simulation engine, code may be generated from the model without the model being simulated. Again, the graphical representation of the at least one resettable hierarchically scoped variable in the time-based graphical modeling environment may differ in appearance from a graphical representation of a non-resettable hierarchically scoped variable in the time-based graphical modeling environment for diagrammatic clarity and ease of use. FIG. 5B shows one illustrative embodiment of the present invention in which a resettable hierarchically scoped Data Store Memory block 382 is indicated by rounded corner box around the block and a "T" enclosed in a circle appearing just above it.

The at least one resettable variable may be conditionally reset. The user may specify a condition that needs to be satisfied for the reset to occur. This could be done using an M-script, for example, or by including a regular expression when the resettable property is set. A condition may be obtained from a user for resetting the at least one resettable variable. The resettable variable would only be reset during a particular subsequent invocation if the condition is satisfied.

FIG. 3B also depicts two additional steps that may be included in step 510 according to aspects of the illustrative embodiment. Resetting the at least one resettable variable to a preset value may include determining an execution context of a resettable Data Store Memory definition block (step 510*a*). An execution context is used in execution of block diagrams within SIMULINK. In general, SIMULINK defines an execution context as a set of blocks to be executed as a unit. At model compilation time, SIMULINK associates an execution context with the model's root system and with each of its nonvirtual subsystems. Initially, the execution context of the root system and each nonvirtual subsystem is simply the blocks that it contains. At the end of model compilation, SIMULINK propagates and consolidates various execution contexts and every block in SIMULINK can be associated with an execution context. Each execution context may contain blocks whose execution is contingent upon the execution of the other blocks. So, when one block in an execution context is executed and provides a new value for a variable shared with other blocks in the execution context, the other blocks in the execution context may have to be executed as well. Also, SIMULINK sorts the order of execution of the blocks within the execution context. A value of the resettable Data Store Memory may be reset before execution of a first block in the execution context (step 510*b*). This step assures that the value of the resettable hierarchically scoped Data Store Memory is reset before it is used or accessed during execution.

A state diagram, or statechart, contains "states" that may represent the mode of an object in an instant in time. A state in a state diagram can include a variable and an action. Changes from one state to another are "transitions". These "transitions" are triggered by "events" and may send the "event" from one state to another using an event broadcast. Broadcasts may be used to send an event to one or more states that are not connected by transitions. "Actions" take place during the execution of a state diagram. An action can occur upon entering a state, while in a state, upon leaving a state, upon a transition, upon evaluating a condition, etc.

State diagrams and state charts, which are defined to be block diagram based graphical models, are hierarchical and can contain parallel elements. States may exist within other states in a hierarchical state diagram. A state within a state is sometimes referred to as a sub-state. A state that contains sub-states is said to be a super-state or a parent state. The sub-states within the super state or parent state are also known as its children, its child states or its descendants. States within a state diagram may be "AND" states, also known as parallel states. Multiple parallel states, usually denoted by a dotted outline, may be active simultaneously.

A state chart or a state diagram is evaluated when it awakens. When a state within a state chart or state diagram "wakes up" or is evaluated it performs a number of operations. First, if the state is active, it checks to see if any, outer transitions (transitions out of the state) are valid, and, if there is a valid outer transition, makes the transition. If there is no valid outer transition then the state executes its "during" action. If there is no specified during action, or when the during action completes, then the state checks to see if there are any valid inner transitions, and, if there is a valid inner transition, makes that transition. If there are no inner transitions, then the state wakes up its substates.

FIG. 3C depicts a flow chart 600 of the steps performed in realizing a resettable hierarchically scoped variable in a state diagramming environment. Initially, at least one resettable hierarchically scoped variable is created in a selected part of a state diagram (step 605). The at least one resettable hierarchically scoped variable may be created in response to a determination by a user whether the hierarchically scoped variable is to be resettable. The option of a resettable hierarchically scoped variable may be presented to the user in a variety of ways known to those skilled in the art, such as a drop down menu, check-box, two-position switch, the use of two different symbols for resettable and non-resettable, or any other form of graphical or non-graphical selection. The at least one resettable variable is assigned a value before or during an invocation of the selected part of the state diagram (step 610). The selected part of the state diagram may be at any level of the hierarchy. The selected part of the state diagram may be the top super-state or chart, it may be the bottom sub-state, or any state in-between. The at least one resettable variable is reset to a preset value during a subsequent invocation of the selected part of the state diagram (step 615). In the STATEFLOW state diagramming application, an invocation of a selected part of a state diagram is referred to as a "wake-up" or "awakening" of the state chart or state. The step of resetting the at least one resettable hierarchically scoped variable to have a reset value during a subsequent invocation of the selected part of the state diagram can occur directly after the invocation of the selected part of the state diagram and before any other activity. Alternatively, the resetting may occur in the previous invocation after processing of the selected part of the state diagram has been completed. This ensures that the variable is reset before its value is used by the selected part of the state diagram. In an alternative illustrative embodiment of the invention, code may be generated for the state diagram (step 620). Again, the code can be generated in any of C, C++, Java, Javascript, Python, a hardware description language or any other language that may be known to one skilled in the art. The state diagram with a resettable hierarchically scoped variable may be simulated, either in an interpretive mode or using generated code. Code generation does not require a simulation engine. Code may be generated from the state diagram without simulation of the state diagram.

The subsequent invocation may be a function call. A function-call subsystem is a subsystem that is executed in response to a function-call that is made to it. The function-call may be initiated by a function-call initiator such as a state transition diagram or a function-call generator, for example. The function-call subsystem can execute any number of times at one point in logical time. The function-call initiator may be part of the sorting that is done to arrive at an execution order. Likewise, a state transition diagram such as a statechart may make a function call to a function that is a graphical function.

Figure 4A:
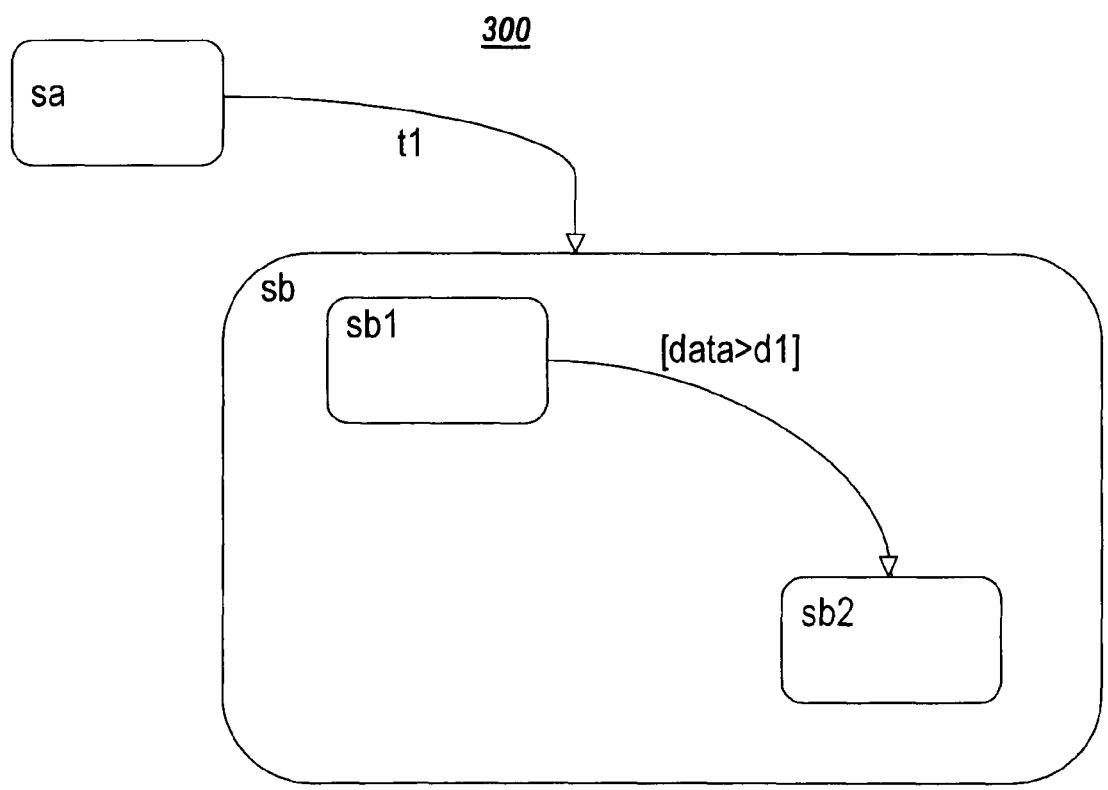
FIG. 4A depicts a state diagram.
Figure 4B:
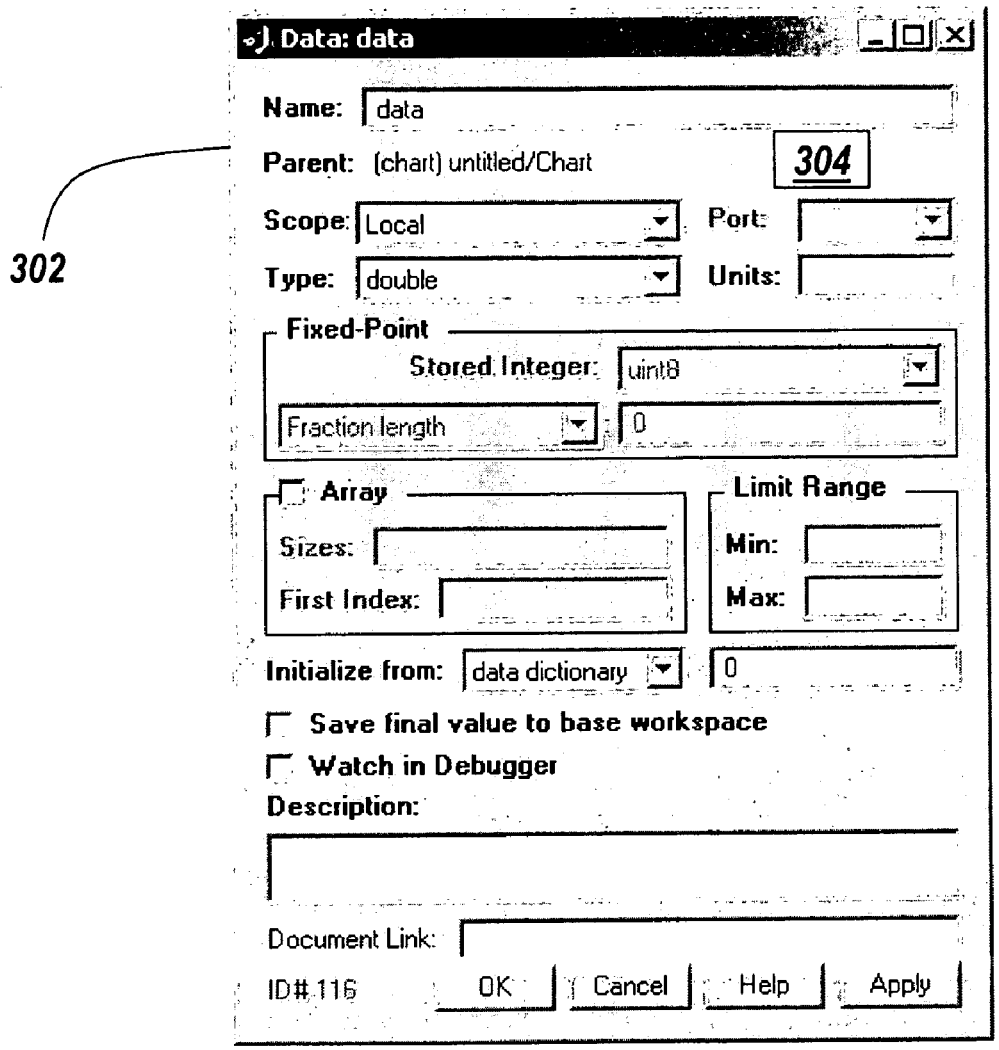
FIG. 4B depicts a menu for selecting data variable properties within the Stateflow® environment.
Figure 4C:
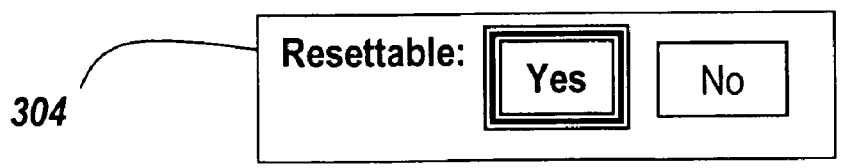
FIG. 4C depicts an addition to the menu depicted in FIG. 4B that allows a user to specify that a hierarchically scoped variable is resettable.

FIG. 4A shows a graphical representation of a sample state diagram. FIG. 4B shows a menu 302 that the STATEFLOW modeling environment employs to allow users to determine the properties of a variable. An addition 304 can be made to the menu 302 to allow a user to specify that a hierarchically scoped variable is resettable or is not resettable. FIG. 4C illustrates one illustrative embodiment of the addition 304 to the menu 302 that allows a user to select whether a given variable would be resettable or not resettable by selecting either yes or no.

Figure 4D:
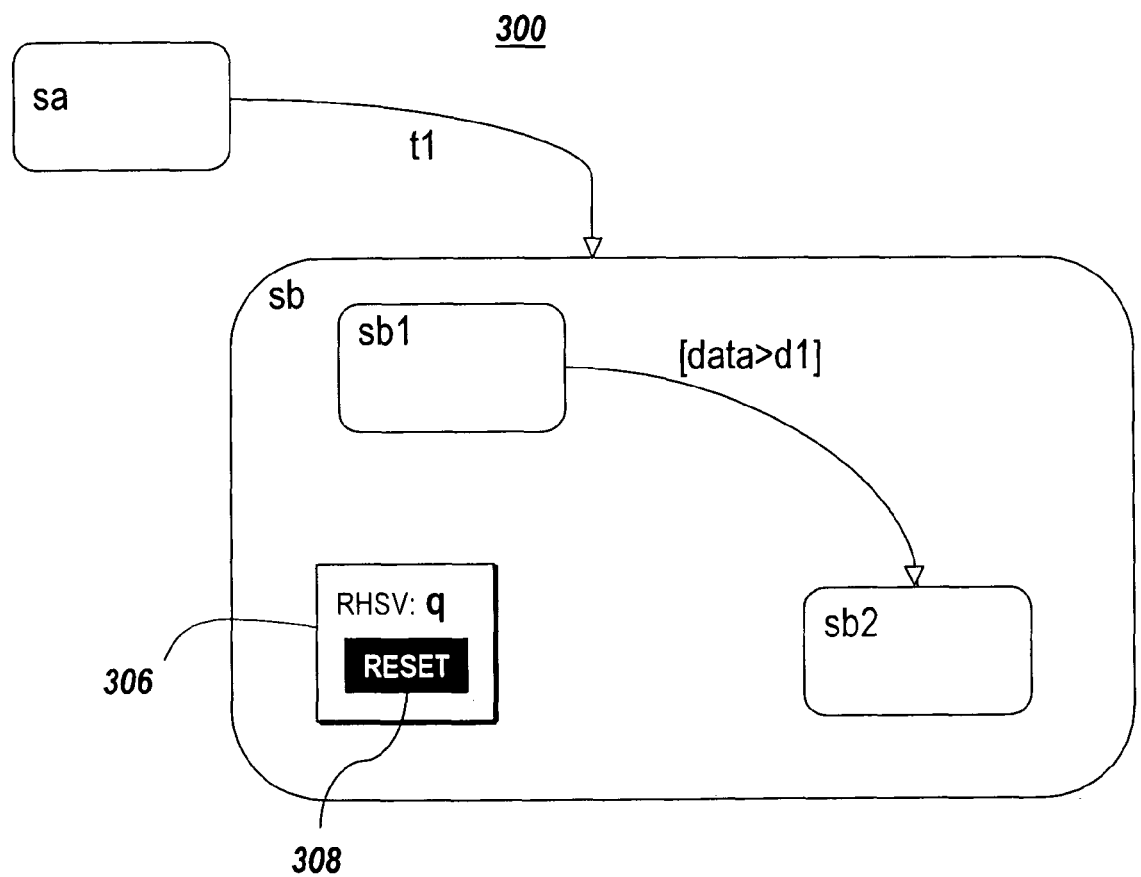
FIG. 4D depicts the state diagram of FIG. 4A including a graphical affordance depicting a resettable hierarchically scoped variable (RHSV)

FIG. 4D depicts the state diagram of FIG. 4A including a graphical affordance 306 depicting a resettable hierarchically scoped variable (RHSV). The graphical affordance 306 indicates the presence of a resettable hierarchically scoped variable named "q" and may graphically indicate additional information about "q." For example, a reset indicator signal 308 may brighten when the value of variable q is reset. The graphical affordance 306 may become highlighted; change color; flash; become underlined, italicized or bolded; be indicated by an arrow, or any other marker; or may be encompassed by a shape such as a rectangle, square, circle or oval the border of which may be any color or highlighted and the interior of which may be shaded in any color or pattern when the value of variable q is reset. The graphical affordance 306 may always be visible or may only be visible under certain conditions such as when the state sb is active, when an option like "view variables" is selected, or when a pointing indicator is graphically positioned over the state in which q is located, etc.

The illustrative embodiments are generally directed to methods and systems for realizing one or more resettable hierarchically scoped variables within a graphical modeling environment. Persistence and scope are decoupled by providing a resettable variable that is hierarchical in scope within a graphical modeling environment allowing greater flexibility for a user. Additionally, the illustrative embodiments may avoid difficulties associated with initializing a hierarchically scoped variable "manually" for each invocation of a selected portion of a graphical model before that variable is accessed.

Although the present invention has been described with reference to the example embodiments illustrated in the figures, it should be understood that many alternative forms can embody the present invention. It is, therefore, expressly noted that the present invention is not limited to these illustrative embodiments, but rather the intention is that additions and modifications to what is expressly described herein also are included within the scope of the invention. Moreover, it is to be understood that the features of the various illustrative embodiments described herein are not mutually exclusive and can exist in various combinations and permutations, even if such combinations or permutations are not made express herein, without departing from the spirit and scope of the invention.

What is claimed as new and desired to be protected by Letters Patent of the United States is:

1. In a computing device having a state diagramming environment, a method comprising:

receiving from a user an indication that at least one variable is a resettable variable in a selected part of a state diagram within the state diagramming environment, the at least one resettable variable being hierarchically scoped;

assigning the at least one resettable variable a value before or during an invocation of the selected part of the state diagram;

setting the at least one resettable variable to a second value during the invocation of the selected part of the state diagram; and automatically resetting the at least one resettable variable to the preset value before or during a subsequent invocation of the selected part of the state diagram, the resetting including:

determining when the selected part of the state diagram is awakened, and resetting a value of the resettable variable directly after the selected part of the state diagram is awakened before the resettable variable is accessed in the selected part of the state diagram.

2. The method of claim 1, further comprising creating at least one resettable variable in a selected part of a state diagram within the state diagramming environment in response to a determination from a user that a hierarchically scoped variable in a selected part of a state diagram within the state diagramming environment will be resettable.

3. The method of claim 1, wherein a graphical representation of the at least one resettable variable in the graphical modeling environment differs in appearance from a graphical representation of a non-resettable variable in the graphical modeling environment.

4. The method of claim 1, wherein the subsequent invocation is a function call.

5. The method of claim 1, further comprising:

automatically generating code for the model.

6. The method of claim 5, wherein the code is generated in one of C, C++, Java, Javascript, and Python.

7. The method of claim 5, wherein the code is generated in one of Verilog, VHDL, and SystemC.

8. The method of claim 1, further comprising:

obtaining from a user a condition for resetting the at least one resettable variable, wherein the at least one resettable variable is reset during a particular subsequent invocation only if the condition is satisfied.

9. A tangible computer-readable medium for use with a computing device, the medium holding one or more computer-executable instructions for: receiving from a user an indication that at least one variable is a resettable variable in a selected part of a state diagram within the state diagramming environment, the at least one resettable variable being hierarchically scoped;

assigning the at least one resettable variable a value before or during an invocation of the selected part of the state diagram;

setting the resettable variable to a second value during the invocation of the selected part of the state diagram; and automatically resetting the at least one resettable variable to the preset value before or during a subsequent invocation of the selected part of the state diagram, the resetting including:

determining that processing of the selected part of the state diagram is completed, and resetting a value of the resettable variable directly after the selected part of the state diagram is awakened before the resettable variable is accessed in the selected part of the state diagram.

10. The medium of claim 9 further comprising creating at least one resettable variable in a selected part of a state diagram within the state diagramming environment in response to a determination from a user that a resettable hierarchically scoped variable in a selected part of a state diagram within the state diagramming environment will be resettable.

11. The medium of claim 9, wherein a graphical representation of the at least one resettable variable in the graphical modeling environment differs in appearance from a graphical representation of a non-resettable variable in the graphical modeling environment.

12. The medium of claim 9, wherein the subsequent invocation is a function call.

13. The medium of claim 9, said medium holding further instructions for:

automatically generating code for the model.

14. The medium of claim 13, wherein the code is generated in one of C, C++, Java, Javascript, and Python.

15. The medium of claim 13, wherein the code is generated in one of Verilog, VHDL, and SystemC.

16. The medium of claim 9, further holding instructions for:

obtaining from a user a condition for resetting the at least one resettable variable, wherein the at least one resettable variable is reset during a particular subsequent invocation only if the condition is satisfied.

17. A computer-implemented system for generating and displaying a graphical modeling application, the system comprising:

a processor for:

receiving from a user an indication that at least one variable is a resettable variable in a selected part of a state diagram within the state diagramming environment the at least one resettable variable being hierarchically scoped; and assigning the at least one resettable variable a value before or during an invocation of the selected part of the state diagram;

setting the resettable variable to a second value during the invocation of the selected part of the state diagram; and automatically resetting the at least one resettable variable to the preset value before or during a subsequent invocation of the selected part of the state diagram, the resetting including:

determining that processing of the selected part of the state diagram is completed, and resetting a value of the resettable variable directly after the selected part of the state diagram is awakened before the resettable variable is accessed in the selected part of the state diagram.

\* \* \* \* \*